US007024641B1

(12) United States Patent
Watkins

(10) Patent No.: US 7,024,641 B1
(45) Date of Patent: Apr. 4, 2006

(54) INTEGRATED CIRCUIT HAVING A PROGRAMMABLE GATE ARRAY AND A FIELD PROGRAMMABLE GATE ARRAY AND METHODS OF DESIGNING AND MANUFACTURING THE SAME USING TESTING IC BEFORE CONFIGURING FPGA

(75) Inventor: Daniel R. Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 323 days.

(21) Appl. No.: 10/119,821

(22) Filed: Apr. 10, 2002

(51) Int. Cl.
*G06F 17/50* (2006.01)

(52) U.S. Cl. .............................. 716/4; 716/11; 716/17; 716/21

(58) Field of Classification Search ................... 703/17, 703/14; 716/6, 12, 16, 17, 4, 11, 21; 713/401; 714/39
See application file for complete search history.

(56) References Cited

U.S. PATENT DOCUMENTS

| | | | | |
|---|---|---|---|---|
| 5,930,153 | A  * | 7/1999 | Melville et al. | 703/14 |
| 6,151,682 | A  * | 11/2000 | van der Wal et al. | 713/401 |
| 6,321,366 | B1 * | 11/2001 | Tseng et al. | 716/6 |
| 6,389,558 | B1 * | 5/2002 | Herrmann et al. | 714/39 |
| 6,904,586 | B1 * | 6/2005 | Bemanian et al. | 716/16 |

OTHER PUBLICATIONS

"A Reconfigurable Multi-Function Computing Cache Architecture" by Hue-Sung Kim, et al.; DCNL Conference 2000; 10 pages.
"A C Compiler for a Processor With a Reconfigurable Functional Unit" by Zhi Alex Ye, et al.; FPGA 2000; 6 pages.
"Communicating Logic: An Alternative Embedded Stream Processing Paradigm" by Norbert Imlig, et al.; ASP-DAC 2000; 6 pages.
Reconfigurable Computing: Its Concept and a Practical Embodiment Using Newly Developed Dynamically Reconfigurable Logic (DRL) LSI; by Masakazu Yamashina, et al.; ASP-DAC 2000; 4 pages.
"A Representation for Dynamic Graphs in Reconfigurable Hardware and its Application to Fundamental Graph Algorithms" by Lorenz Huelsbergen; FPGA Feb. 2000; 5 pages.
"A Benchmark Suite for Evaluating Configurable Computing Systems—Status, Reflections, and Future Directions" by S. Kumar, et al.; FPGA 2000; 9 pages.
"The Application of Genetic Algorithms to the Design of Reconfigurable Reasoning VLSI Chips" by Moritoshi Yasunaga, et al.; FPGA 2000; 10 pages.

(Continued)

*Primary Examiner*—Thuan Do
(74) *Attorney, Agent, or Firm*—Hitt Gaines PC

(57) ABSTRACT

The present invention provides an integrated circuit (IC). In one embodiment, the IC includes a substrate and a plurality of gate array blocks located on the substrate. Each of the blocks includes a programmable gate array (PGA) containing at least a portion of a circuit design in an interconnect layer thereof, and a field-programmable gate array (FPGA) coupled to the PGA and capable of containing a configuration that augments the portion of the circuit design. In this embodiment, the PGA and the FPGA cooperate to effect the circuit design. In another aspect, the present invention provides a method of designing an IC. In yet another aspect, the present invention provides a method of manufacturing ICs.

8 Claims, 3 Drawing Sheets

OTHER PUBLICATIONS

"Reconfigurable Computing: What, Why, and Implications for Design Automation" by Andre DeHorn and John Wawrzynek; DAC 1999; 6 pages.

"MorphoSys: Case Study of a Reconfigurable Computing System Targeting Multimedia Applications" by Hartej Singh, et al.; DAC 2000; 6 pages.

"An Architecture-Driven Metric for Simultaneous Placement and Global Routing for FPGA's" by Yao-Wen Chang and Yu-Tsang Chang: DAC 2000; 6 pages.

"Using General-Purpose Programming Languages for FPGA Design" by Brad L. Hutchings and Brent E. Nelson; DAC 2000; 6 pages.

"Dynamically Reconfigurable Architecture for Image Processor Applications" by Alexandro M.S. Adario, et al.; DAC 1999; 6 pages.

"An Automated Temporal Partitioning and Loop Fission Approach for FPGA Based Reconfigurable Synthesis of DSP Applications" by Meenakshi Kaul, et al.; DAC 1999; 7 pages.

"A Scheduling and Allocation Method to Reduce Data Transfer Time by Dynamic Reconfiguration" by Kazuhito Ito, 2000 Asia & South Pacific DAC; 6 pages.

\* cited by examiner

INTEGRATED CIRCUIT HAVING A PROGRAMMABLE GATE ARRAY AND A FIELD PROGRAMMABLE GATE ARRAY AND METHODS OF DESIGNING AND MANUFACTURING THE SAME USING TESTING IC BEFORE CONFIGURING FPGA

TECHNICAL FIELD OF THE INVENTION

The present invention is directed, in general, to integrated circuits, and, more specifically, to an integrated circuit having a programmable gate array (PGA) and a field programmable gate array (FPGA) and methods of designing and manufacturing the integrated circuit.

BACKGROUND OF THE INVENTION

In the field of semiconductor blocks, several factors must typically be balanced when designing and manufacturing integrated circuits (ICs) for use in various applications. Among these factors are circuit complexity, operation speed, substrate real estate and the diversity of tasks the IC may be called upon to handle. All of these have a potential impact on overall manufacturing cost. Ideally, designers and manufacturers seek ICs having the smallest substrate real estate, yet operate the fastest and are the least complex in design. Practically, however, as one desirable characteristic is optimized, another characteristic suffers.

For example, application specific integrated circuits (ASICs) are extremely fast at the tasks they are designed to handle. Generally speaking, ASICs are constructed by designing a circuit for specific operations, and then forming only the necessary semiconductor blocks (in the desired layout) on a substrate, as well as the customized interconnects needed among the blocks, to accomplish the desired tasks. Because the circuitry employed (both blocks and interconnects) is tailored to specific operations, ASICs typically occupy only that amount of substrate real estate needed to accomplish its goals. Unfortunately, the speed and small real estate achievable with ASICs come at the expense of their post-design flexibility. Since ASICs are designed with specific tasks in mind, their ability to handle tasks outside their design is very limited, if present at all.

At the other end of the spectrum are field programmable gate arrays (FPGAs). FPGAs are constructed by forming standard layouts of semiconductor blocks on a substrate, but then allowing the interconnection of these blocks to be programmable as the need arises. In this manner, FPGAs are reprogrammable in the "field," depending on the desired operation to be performed. However, the flexibility of the FPGAs comes at the expense of both speed and real estate. More specifically, since the tasks for which an FPGA will be used in not predetermined, a sufficient number of semiconductor blocks (forming logic gates) must typically be formed to allow the FPGA to perform a variety of operations. In addition, although a relatively large number of blocks are formed in the FPGA, not all the blocks are used for each task; thus, unused blocks often occupy valuable space no matter what task is being performed. Furthermore, since the block layout is not tailored for specific tasks, many blocks may have to be employed to perform the same function that a lesser number of blocks in a custom designed ASIC could. As a result, the speed of FPGAs typically suffers as a greater number of blocks are required to perform a desired operation.

Lying between ASICs and FPGAs are programmable gate arrays (PGAs). PGAs are constructed by forming standard semiconductor block layouts on a substrate, similar to FPGAs. However, the layout of the interconnects for the blocks is typically customized for desired operations. Thus, PGAs provide lower manufacturing costs than ASICs, due primarily to the use of standard block layouts instead of custom designed layouts, and faster speed than FPGAS, due to the customized dedicated interconnect structures. Unfortunately, since tasks-specific interconnects are employed, PGAs still suffer from the limited number of tasks they may perform. Moreover, with a PGA, if minor defects are found in the final IC die, a new interconnect layout must typically be created, and new dies manufactured, to overcome the defects. In view of the costs associated with creating new interconnect layer reticles and constructing new IC dies, manufacturers are understandably eager to find an alternative logic block having the desired flexibility. This is especially the case in those situations where the defects affect block performance, but perhaps not enough to warrant the expense and delay associated with the construction of new reticles and new IC dies.

Accordingly, what is needed in the art is logic block that does not suffer from the deficiencies typically found in conventional logic block designs.

SUMMARY OF THE INVENTION

To address the above-discussed deficiencies of the prior art, the present invention provides an integrated circuit (IC). In one embodiment, the IC includes a substrate and a plurality of gate array blocks located on the substrate. Each of the blocks includes a programmable gate array (PGA) containing at least a portion of a circuit design in an interconnect layer thereof, and a field-programmable gate array (FPGA) coupled to the PGA and capable of containing a configuration that augments the portion of the circuit design. In this embodiment, the PGA and the FPGA cooperate to effect the circuit design.

In another aspect, the present invention provides a method of designing an IC. In one embodiment, the method includes forming a plurality of gate array blocks on a substrate. Each of the blocks includes a PGA containing at least a portion of a circuit design in an interconnect layer thereof, and an FPGA coupled to the PGA. The method further includes testing the IC to determine an efficacy of the portion, and producing a configuration for the FPGA that represents an augmenting of the portion. As such, the PGA and the FPGA cooperate to effect the circuit design.

In yet another aspect, the present invention provides a method of manufacturing ICs. In one embodiment, the method includes employing a standard reticle set to fabricate an IC containing an unconfigured PGA and an FPGA coupled thereto. The method also includes forming a custom reticle that defines interconnects for configuring the unconfigured PGA, and employing the custom reticle to form the interconnects and thereby transform the PGA into a portion of a desired circuit design. The method still further includes testing the IC to determine an efficacy of the portion, and producing a configuration for the FPGA that represents an augmenting of the circuit design, where the PGA and the FPGA cooperate to effect the circuit design. In addition, in this embodiment, the method includes manufacturing the ICs using both the standard reticle set and the custom reticle.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
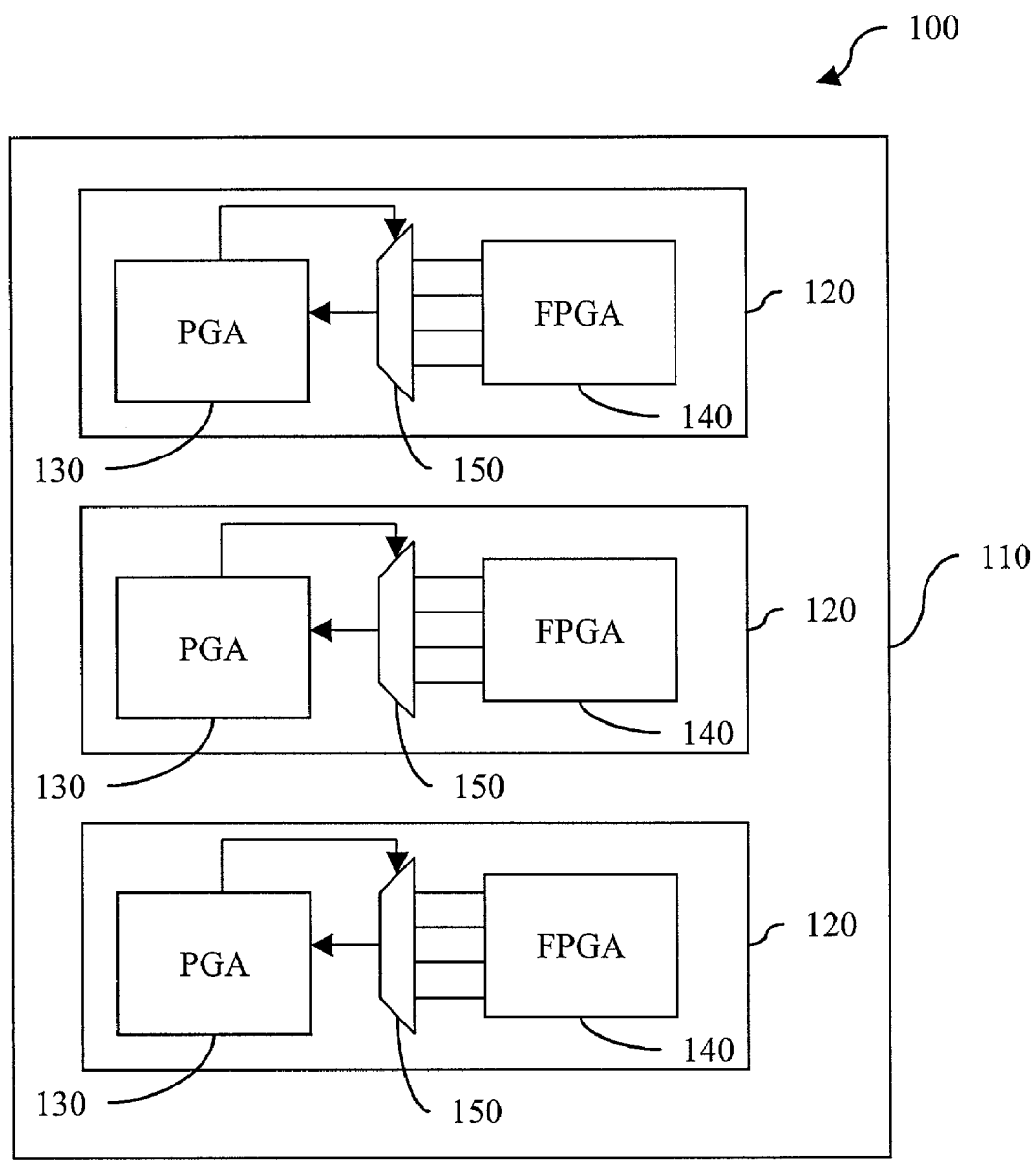
FIG. 1 illustrates a high level block diagram of one embodiment of an IC manufactured constructed according to the principles of the present invention.

Referring initially to FIG. 1, illustrated is a high level block diagram of one embodiment of an IC 100 manufactured constructed according to the principles of the present invention. In the illustrated embodiment, the IC 100 includes a substrate 110. In accordance with conventional practice, the substrate 110 may be comprised of silicon. Of course, other semiconductor materials may also be employed as desired.

Formed on the substrate 110 are a plurality of gate array blocks 120. Although only three blocks 120 are illustrated in FIG. 1, the present invention is broad enough to encompass a single gate array block 120 or any number of multiple blocks 120 without deviating from the broad scope of the present invention. In accordance with the principles of the present invention, each of the blocks 120 includes a PGA 130 containing at least a portion of a circuit design in an interconnect layer thereof. As used herein, a PGA includes a portion of an IC having a standard block layout, and having a specific interconnection layout, for interconnecting those blocks, that is customized for a predetermined range of operations and permanently formed over the blocks when the IC is manufactured. In an advantageous embodiment, each PGA 130 may be manufactured using a standard reticle set to form semiconductor blocks for an unconfigured PGA 130 on the substrate 110. Additionally, a custom reticle may then be used to define and form interconnects for configuring the unconfigured PGA 130. By employing the custom reticle to form the interconnects for the PGA 130, the PGA 130 may be transformed into a portion of the desired circuit design.

The IC 100 also includes FPGAs 140 formed on the substrate 110 and coupled to the PGAs 130. As used herein, an FPGA includes a portion of an IC having a standard block layout, but wherein the interconnections used to create logic gates with those blocks may be programmed in the "field," e.g., after the FPGA is manufactured. In an exemplary embodiment of the present invention, the FPGAs 140 may be formed using the standard reticle set used to form the unconfigured PGA 130. However, in accordance with conventional practice, the interconnections of the gates comprising the FPGAs 140 are not permanently defined. More specifically, how the individual gates of the FPGAs 140 are interconnected are provided by configuring the FPGAs 140 to execute specific operations. Typically, such a configuration would be provided using a software program or similar instructional code. Of course, the present invention is broad enough to encompass other methods for creating a configuration of the FPGAs 140, as the desired operations may demand. The present invention further contemplates that incremental changes can be effected by changes in metal layer interconnections in situations in which such incremental changes cannot fit in the existing PGA/FPGA combination.

In a preferred embodiment of the present invention, each of the blocks 120 in the IC 100 includes a PGA 130 comprising about 85% of the desired circuit design in each block 120. As a result, in the preferred embodiment, each block 120 includes an FPGA 140 comprising about 15% of the circuit design. In a related embodiment, the PGAs 130 include about 14,000 gates and the FPGAs 140 include about 1,500 gates. Of course, the blocks 120 of an IC constructed according to the principles described herein is not so limited, and may encompass any variation in the division of the circuit design. Likewise, the present invention is not limited to any particular number of gates in each of the PGAs 130 and the FPGAs 140.

In accordance with the present invention, the FPGAs 140 are capable of containing a configuration that augments the portion of the circuit design provided by the PGAs 130. In this manner, the PGAs 130 and the FPGAs 140 cooperate to effect the complete circuit design. In an exemplary embodiment, the portion is tested to determine whether and how to augment the portion of the circuit design provided by the PGAS. The manner of testing may include executing a predetermined operation for which the IC 100 has been constructed. In such embodiment, if the portion adequately executes the predetermined operation, the circuit design need not be augmented at this time, and the PGAs 130 on the IC 100 may solely be employed for the operation.

However, in another embodiment, if the IC 100 is desired to execute a new operation, in addition to the predetermined operation, and the testing reveals that the portion is insufficient to execute the new operation, a configuration that augments the portion of the circuit design provided by the PGAs 130 may be programmed using the FPGAs 140. Then, both the PGAs 130 and the FPGAs 140 may be employed to execute both the original and new operations.

In another embodiment, one or more defects may be found during testing in either or both the block layout or the interconnects of the PGAs 130. Those who are skilled in the art understand that although not desirable to the IC 100, defects are often commonplace in the manufacture of IC chips and may affect the overall function of the IC 100 in a derogatory manner. In such situations, a configuration for the FPGAs 140 may be created in response to the defects found in the portion of the circuit design provided by the PGAs 130.

In ICs manufactured according to principles found in the prior art, either or both of the block layout or interconnects of the PGAs 130 would need to be updated to overcome the defects. Typically, such an update would require manufacturing new reticles for the PGAs 130, as well as constructing the new PGAs 130 themselves, both of which add considerable expense to the overall IC manufacturing process. However, by creating a configuration in the FPGAs 140 to overcome any defects, the IC 100 of the present invention provides the benefit of continuing operation without the need to re-manufacture the PGAs 130 and the reticles used to construct the PGAs 130.

Optionally, as in the embodiment illustrated in FIG. 1, multiplexers 150 may be interposed between the PGAs 130 and the FPGAs 140. In such embodiments, the multiplexers 150 are employed to provide communication between the PGAs 130 and the FPGAs 140 in order to execute the desired operations. Although not necessary to the practice of the present invention, employing the multiplexers 150 between the PGAs 130 and the FPGAs 140 may provide for more efficient execution of any operations.

Figure 2:
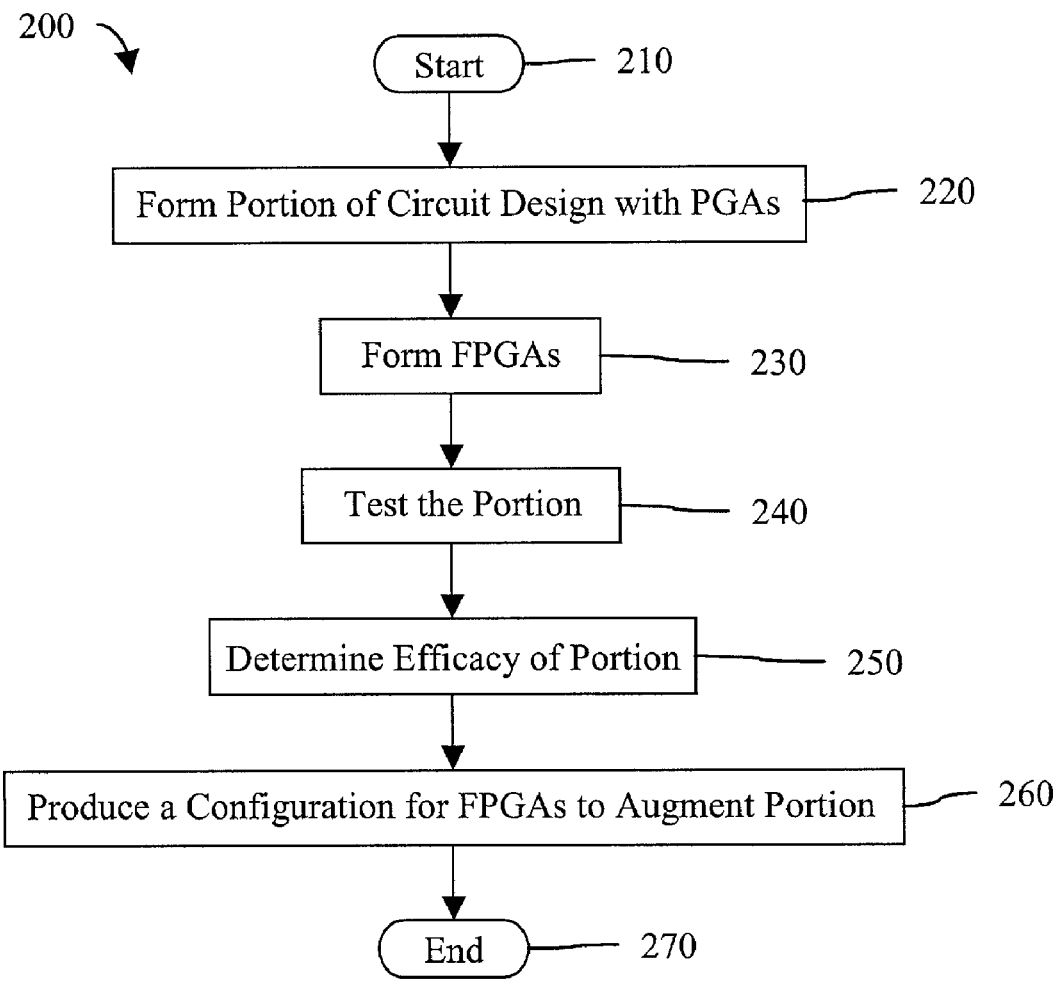
FIG. 2 illustrates a flow diagram of one embodiment of a method of designing an IC carried out according to the present invention.

Turning now to FIG. 2, illustrated is a flow diagram 200 of one embodiment of a method of designing an IC constructed according to the present invention. The method begins at a start step 210 where a plurality of gate array blocks is formed on a substrate. In accordance with the principles described above, each of the blocks includes a PGA and an FPGA. In an exemplary embodiment, a standard layout for the semiconductor blocks comprising the PGAs and FPGAs may be employed.

At a step 220, a portion of a circuit design is formed with the PGAs. The portion is formed in an interconnect layer of the PGAs. At a step 230, FPGAs are formed and coupled to the PGAs. Optionally, as discussed above, multiplexers may be interposed between the PGAs and FPGAs to improve functional efficiency, however they are not necessary to the practice of the present invention. At a step 240, the portion of the IC provided by the PGAs is tested to determine its ability to execute desired operations. Based on the testing, at a step 250, an efficacy of the portion is determined. The efficacy may be determined based on, for example, the ability of the portion to execute new operations not previously considered among any predetermined operations when the portion of the circuit design was originally constructed. Alternatively, the efficacy of the portion may be based on defects in either or both the blocks or interconnects forming the PGAs when executing any predetermined operations.

At a step 260, a configuration is produced for the FPGAs based on the results of the testing. The configuration represents an augmenting of the portion of the circuit design. By producing the configuration, the remainder of the circuit design now provided by the FPGAs advantageously overcomes the defects found during testing or can provide the IC with the ability to execute any new operations desired. With such an augmentation of the circuit portion, the PGAs and FPGAs cooperate to provide a broader functionality of the IC, without requiring consumers to redesign and re-manufacture all or portions of the PGAs. Of course, if no defects are found during testing, or the portion of the circuit design provided by the PGAs adequately executes desired operations, no configuration for the FPGAs need be made. In such a situation, the PGAs provide the entire circuit design, until the need to produce a configuration for the FPGAs arises, if at all. The method ends at an end step 270.

Figure 3:
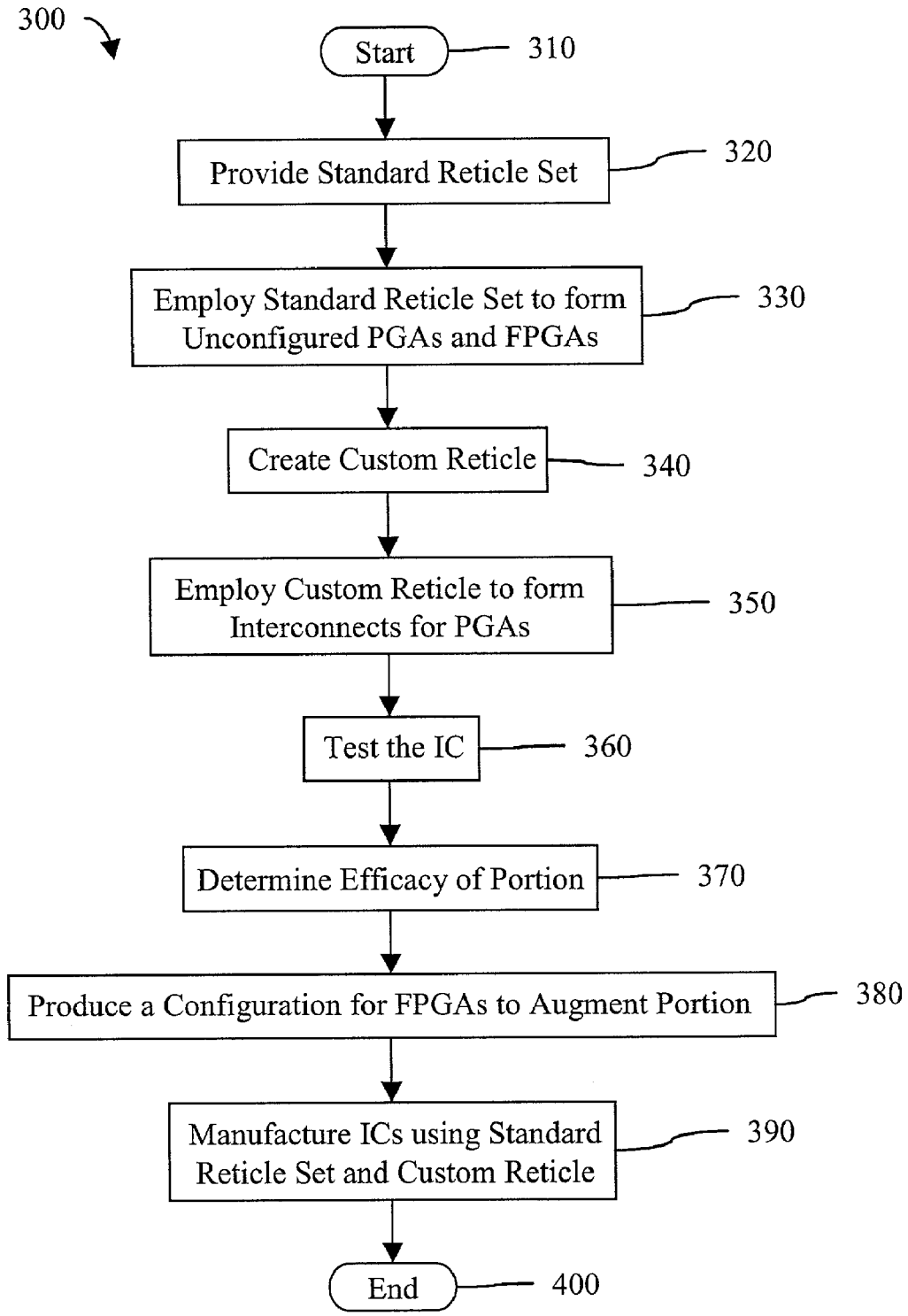
FIG. 3 illustrates a flow diagram of one embodiment of a method of manufacturing ICs carried out according to the present invention.

Turning now to FIG. 3, illustrated is a flow diagram 300 of one embodiment of a method of manufacturing ICs carried out according to the present invention. The method begins at a start step 310, when the design process begins.

At a step 320, a standard reticle set is provided. More specifically, a reticle set having a standard layout of semiconductor blocks is selected based on the type of IC desired. Those who are skilled in the art understand that a number of different standard layouts may be available, depending on the needs of the ICs to be manufactured. At a step 330, the standard reticle set is employed to form unconfigured PGAs, as well as FPGAs. The PGAs and FPGAs may be created using conventional semiconductor formation techniques, which are well known to those who are skilled in the art.

The PGAs are unconfigured since the interconnects coupling the individual blocks therein have not yet been formed. Likewise, the FPGAs are unconfigured since the interconnects therein are typically not configured in any particular manner, until the FPGAs are programmed in the field for a particular range of operations.

At a step 340, a custom reticle is created. The custom reticle is created for use in forming the interconnects of the PGAs. The custom reticle may be created using conventional techniques, however the present invention is not limited to any particular one. The interconnects of the PGAs are designed on the custom reticle depending on the specific application for which the ICs are being constructed. At a step 350, the custom reticle is employed to form the interconnects of the PGAs. Once the interconnects are formed, the PGAs are completed and form a portion of a circuit design chosen for the ICs to execute desired operations. However, since the FPGAs have yet to be programmed, the FPGAs do not yet form any part of the circuit design. As a result, desired operations will only be executed with the PGAs at this time.

At a step 360, the newly formed IC is tested. The tests may include, for example, attempting to execute the desired operations for which the ICs are being manufactured. Additionally, the tests may include executing new operations not previously intended for the circuit design of the ICs. Of course, other tests regarding the functionality of the ICs may also be conducted, as those skilled in the art will understand. At a step 370, an efficacy of the portion of the circuit design provided solely by the PGAs is determined based on the results of the testing.

Examples of such a determination include whether any defects in the portion were found while executing predetermined operations, as well as whether and how well the portion executed new operations not previously considered at the initial conception of the circuit design. Other factors and characteristics affecting the efficacy of the IC may also be determined during testing.

At a step 380, a configuration for the FPGAs is produced. The configuration is produced based on the determination of efficacy of the IC during testing, and is produced so as to augment the portion of the circuit design provided by the PGAs. More specifically, the configuration allows the FPGAs to augment the PGAs in order to overcome defects in the design or construction of the PGA portion of the circuit design, or, alternatively or additionally, provide the overall circuit design of the IC with the ability to execute any new operations desired. As mentioned above, this cooperation between the portion of the circuit design provided by the PGAs and programmability provided by the FPGAs provides broader capabilities for the IC, with regard to overcoming defects and design flaws and expanding functional capabilities, without the need to redesign and re-manufacture circuit portions thereof.

After the FPGAs have been given a configuration, if needed, based on the efficacy of the PGA portion, ICs are then mass-produced for the consumer at a step 390. The ICs are produced by combining the standard reticle set and the custom reticle in a conventional semiconductor manufacturing process. Of course, the present invention is broad enough to encompass later developed semiconductor manufacturing processes as well. The method ends at an end step 400. It should be understood that all or only a portion of the method 300 may be repeated as necessary to achieve a final design. The method 300 supports an iterative design approach, as may be desired in a given application.

By providing a configuration for the FPGAs based on the efficacy of the PGA portion, the mass-production of ICs may proceed with confidence that the completed ICs will function as desired, without the need to return to the beginning of the manufacturing process to create new and expensive reticles in an effort to overcome later-discovered defects or to broaden the operational capabilities of the ICs. With the relatively large cost, as well as delays in the manufacturing process, associated with creating new reticles, manufacturers should understandably be eager to avoid the added expense and delay of starting the manufacturing process over again.

In short, the manufacturing process for ICs now gives customers the choice, when defects in the IC are discovered or the capabilities of the IC is sought to be expanded, to either return to the beginning of the manufacturing process to create new reticles or to simply program a configuration into the circuit design of the IC to overcome any problems or shortcomings.

Although the present invention has been described in detail, those skilled in the art should understand that they can make various changes, substitutions and alterations herein without departing from the spirit and scope of the invention in its broadest form.

What is claimed is:

1. A method of manufacturing integrated circuits (ICs), comprising:
   employing a standard reticle set to fabricate an IC containing an unconfigured programmable gate array (PGA) and a field-programmable gate array (FPGA) coupled thereto;
   forming a custom reticle that defines interconnects for configuring said unconfigured PGA;
   employing said custom reticle to form said interconnects and thereby transform said PGA into a portion of a desired circuit design;
   testing said IC before configuring said FPGA to determine an efficacy of said portion;
   configuring said FPGA to represent an augmenting of said circuit design, said PGA and said FPGA cooperating to effect said circuit design; and
   manufacturing said ICs using both said standard reticle set and said custom reticle.

2. The method as recited in claim 1 wherein said PGA includes about 85% of said circuit design and said FPGA includes about 15% of said circuit design.

3. The method as recited in claim 1 wherein said testing includes executing a predetermined operation using only said portion.

4. The method as recited in claim 1 wherein said configuring includes producing a configuration for executing a new operation.

5. The method as recited in claim 1 wherein said configuring includes producing a configuration in response to a defect discovered in said portion.

6. The method as recited in claim 1 further including interposing a multiplexer between said PGA and said FPGA.

7. The method as recited in claim 1 wherein said employing a standard reticle set includes employing a standard reticle set to fabricate an IC containing an unconfigured PGA having about 14,000 gates and an FPGA having about 1,500 gates coupled thereto.

8. The method as recited in claim 1 wherein said testing and configuring are carried out in a sequence of software instructions executable in a computer.

* * * * *